United States Patent [19]

Sekine et al.

[11] Patent Number: 5,274,341

[45] Date of Patent: Dec. 28, 1993

[54] HIGH-FREQUENCY POWER AMPLIFIER

[75] Inventors: Kenji Sekine, Nishitama; Masami Ohnishi, Hachiouji; Haruhiko Funaki, Tanashi; Nobuo Masuda, Higashimurayama; Akio Iso, Yokosuka, all of Japan

[73] Assignees: Hitachi, Ltd.; Space Communications Research Corporation, both of Tokyo, Japan

[21] Appl. No.: 914,408

[22] Filed: Jul. 17, 1992

[30] Foreign Application Priority Data

Jul. 19, 1991 [JP] Japan .................. 3-179213

[51] Int. Cl.[5] .............................. H03F 3/26
[52] U.S. Cl. ..................... 330/269; 330/277; 330/295; 330/306
[58] Field of Search ............ 330/55, 124 R, 251, 330/269, 277, 295, 306

[56] References Cited

U.S. PATENT DOCUMENTS 4,772,856 9/1988 Nojima et al. ............ 330/295 X
5,105,167 4/1992 Peczalski ................. 330/285

FOREIGN PATENT DOCUMENTS 116808 7/1983 Japan .
159002 9/1983 Japan .

OTHER PUBLICATIONS

Nojima et al, "High Efficiency GaAs FET Harmonic-Reaction-Amplifiers (HRA)", Proceedings of the 1989 Information and Communication Engineers of Japan, Paper No. SC-9-5, pp. 2-708, 2-709.

Primary Examiner—James B. Mullins
Attorney, Agent, or Firm—Antonelli, Terry, Stout & Kraus

[57] ABSTRACT

A high-frequency power amplifier comprises a pair of FETs, a divider which supplies opposite-phase versions of a signal to be amplified to the FETs, distributed-parameter transmission lines connected respectively at one ends thereof to output electrodes of the FETs, and a combiner which combines signals appearing at another ends of the transmission lines into a signal of a common phase. Stubs which short-circuit for even harmonics included in output signals of the FETs are connected respectively to the transmission lines at positions distant from the output electrodes of the FETs by a multiple of a quarter wavelength of the fundamental wave included in the output signals of the FETs. A first capacitor is connected between the transmission lines at positions distant from the output electrodes of the FETs by the 1/12 wavelength of the fundamental wave included in the output signals of the FETs so that the output electrodes of the FETs are open for the third harmonic, and a second capacitor is connected between the transmission lines at positions between the connecting positions of the first capacitor and the connecting positions of the stubs so as to perform impedance matching for the fundamental wave included in the output signals of the FETs.

6 Claims, 6 Drawing Sheets

HIGH-FREQUENCY POWER AMPLIFIER

BACKGROUND OF THE INVENTION

The present invention relates to a high-frequency power amplifier, and more particularly to a high-efficiency power amplifier formed of amplifying devices operating in a high frequency region and an impedance matching circuit coupled to the output terminals of the amplifying devices.

In order to operate a high-frequency power amplifier efficiently, there is known a technique of providing the amplifier with a matching circuit which is designed in consideration of the impedance for the high-frequency signal and its harmonics to be amplified. For example, a field effect transistor (FET) as an amplifying device can ideally behave a 100% drain efficiency by having a load impedance of zero for even harmonics and a load impedance of infinity for odd harmonics.

FIG. 6(a) shows the conventional arrangement of a high-frequency power amplifier provided with the above-mentioned impedance matching circuit for harmonics, in which an FET 67 as an amplifying device is connected on its output with a resonance circuit 68, which behaves parallel resonation at the fundamental wave of the signal to be amplified, through a transmission line 69 having a length equal to the quarter wavelength of the fundamental wave. With the gate voltage being set to the pinch-off point, the amplifying device operates for a large-swing input signal to have a drain voltage Vd and drain current Id as shown in FIG. 6(b). Namely, the drain voltage Vd has a rectangular waveform including the fundamental wave and odd harmonics and the drain current Id has a half-wave rectified waveform including the fundamental wave and even harmonics. Since the voltage and current do not exist at the same time, no power is dissipated in the device, resulting in a 100% operational efficiency.

However, practical amplifiers involve a device loss and circuit loss, particularly in the high-frequency region, and the above-mentioned ideal operation is not yet accomplished. Specific examples of the circuit arrangement of the amplifier operating in a high-frequency region of several hundreds MHz and above, which use a distributed-parameter transmission line to control the second harmonic, are proposed in Japanese Patent Application Laid-Open Nos. 58-159002 and 58-116808. Another example which is based on the parallel operation of two amplifying devices is described in the proceedings of the 1989 spring convention of The Institute of Electronics, Information and Communication Engineers of Japan, Paper No. SC-9-5, pp. 2-708 and 2-709.

A typical use of high-efficiency power amplifiers is for RF transmission amplifiers, in which large power output is required as well as high operational efficiency in many cases. Conventional techniques for getting a large power output include the parallel operation of two amplifying devices in in-phase mode and the push-pull operation of two amplifying devices in opposite phase mode.

SUMMARY OF THE INVENTION

An object of the present invention is to provide an amplifier of the push-pull configuration of two amplifying devices operating in opposite phase mode, wherein the amplifier provides a short-circuit load impedance for even harmonics, open load impedance for odd harmonics and impedance matching for the fundamental wave, so that it performs for both large power output and high operational efficiency.

In order to achieve the above objective, the amplifier based on an embodiment of this invention comprises a pair of amplifying devices receiving input signals in opposite phases, distributed-parameter transmission lines connected at the outputs of the amplifying devices, stubs, which have a length of the quarter wavelength of the signal (fundamental wave) to be amplified and are short-circuited at one ends, connected in parallel to the transmission lines at the positions distant from the outputs of the amplifying devices by a multiple of the quarter wavelength of the fundamental wave, a capacitor connected between the transmission lines at the positions of a 1/12 wavelength of the fundamental wave, and another capacitor connected between the transmission lines at the positions between the connecting positions of the first-mentioned capacitor and the connecting positions of the stub.

The distributed-parameter transmission line is a microstrip line formed of a central conductor on a ground conductor by being interleaved by dielectric material, or a coplanar microstrip line formed of a central conductor and ground conductor arranged on a plane, or a triplate line formed of a central conductor placed between an upper and lower ground conductors. The amplifying device is a semiconductor amplifying device such as an FET.

The amplifier based on another embodiment of this invention includes, in place of the short-circuit stubs of quarter wavelength or the capacitor disposed at the 1/12 wavelength position, a parallel resonance circuit formed of a capacitance and inductance of lumped parameters and adapted to behave parallel resonation for the fundamental wave.

The voltage waveforms of the high-frequency signals which appear at the outputs of the amplifying devices that receive input signals in opposite phases will be explained with reference to FIG. 4(a) and FIG. 4(b). FIG. 4(a) shows the basic circuit arrangement, and FIG. 4(b) shows the high-frequency signal voltages on the output transmission lines. Indicated by V1 and V2 are the fundamental components appearing on the transmission lines, and V12 and V22 are the second harmonics. The V1 and V2 are out of phase by 180°, while the V12 and V22 are in-phase with each other. Although only the fundamental waves and the second harmonic are shown, any pair of odd harmonics have opposite phases and any pair of even harmonics have a common phase.

According to the first-mentioned embodiment of this invention, the output terminal of the amplifying device has a short-circuit load impedance for the second harmonic (even harmonics) by means of the short-circuit stub of quarter wavelength. The capacitors connected between the transmission lines affect only the fundamental wave and odd harmonics, and have no influence on even harmonics because these harmonics create no potential differences between the transmission lines. The capacitor connected at the position of 1/12 wavelength provides an open circuit for the third harmonic, and another capacitor behaves impedance matching for the fundamental wave.

DESCRIPTION OF THE PREFERRED EMBODIMENTS

Embodiments of the present invention will be described in detail.

Figure 1:
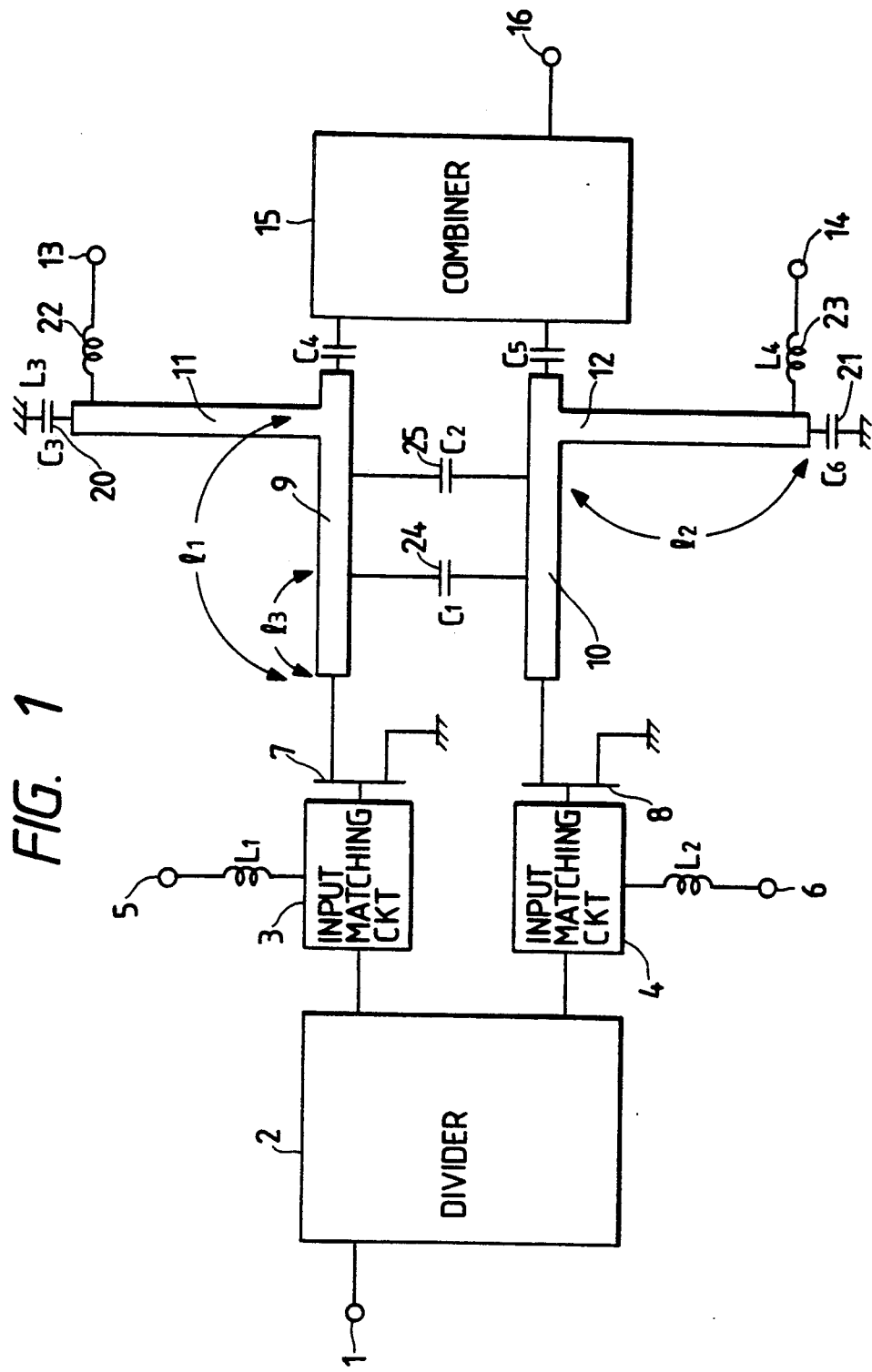
FIG. 1 is a schematic diagram of a high-frequency power amplifier based on a first embodiment of the present invention.

FIG. 1 is a schematic diagram of an amplifier based on a first embodiment of the present invention. An input signal received on an input terminal 1 is fed to a divider 2 which produces two signals in opposite phases from the input signal. The signals in opposite phases are fed to a pair of input matching circuits 3 and 4, and the their outputs in opposite phases are applied to a pair of amplifying devices 7 and 8, i.e., to gates of field effect transistors (FETs). The FETs are supplied with gate bias voltages on bias terminals 5 and 6 through inductances $L_1$ and $L_2$. Connected on drains, i.e., output electrodes, of the FETs are distributed-parameter transmission lines 9 and 10 having the structure of microstrip line, and at positions on the transmission lines distant from the FET drain electrodes by the quarter wavelength of the input signal (fundamental wave) ($l_1$), there are connected stubs 11 and 12 having a length of quarter wavelength ($l_2$) with their one ends shorted through capacitors $C_3$ and $C_6$. These short-circuit stubs are open and have no influence for the fundamental wave and odd harmonics, but function to short-circuit at the connecting point on the transmission lines, causing them to short-circuit at the drain electrodes, for even harmonics. A capacitor $C_1$ is connected between the transmission lines at positions of the 1/12 wavelength ($l_3$) of the fundamental wave so that the transmission lines are virtually open at the drain electrodes for the third harmonic. Further connected between the transmission lines at positions between the connecting positions of the capacitor $C_1$ and the connecting positions of the stubs is another capacitor $C_2$ for behaving impedance matching with the fundamental wave by optimizing the connecting position of this capacitor.

A drain bias is applied to the stubs on their bias terminals 13 and 14 through inductances $L_3$ and $L_4$. The fundamental components in opposite phases are led out of the transmission lines through d.c. cutoff capacitors $C_4$ and $C_5$ to a combiner 15, by which the fundamental components are combined to have a common phase and delivered to an output terminal 16.

Figure 5A:
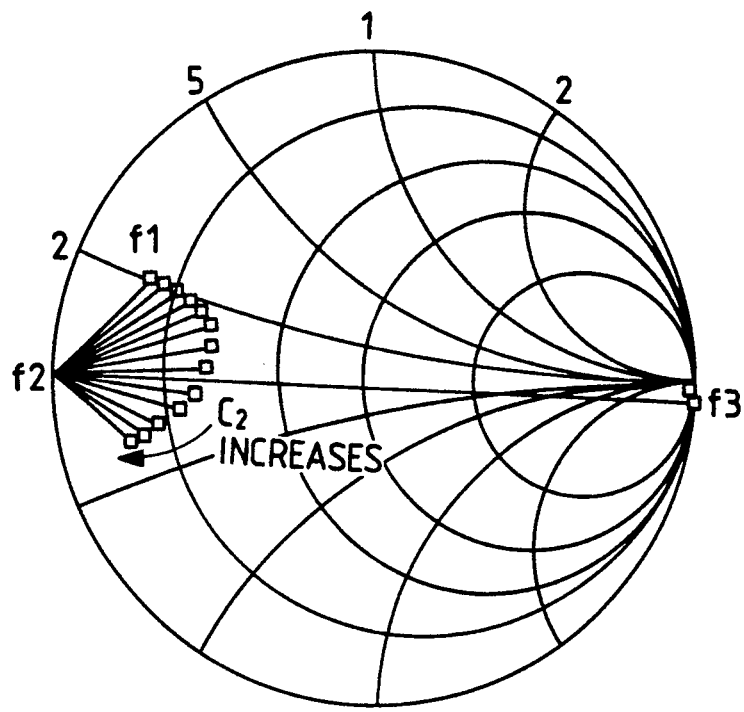
FIG. 5(a) and FIG. 5(b) are Smith charts showing the load impedances seen from the drain electrodes of the FETs in the high-frequency power amplifier shown in FIG. 1.
Figure 5B:
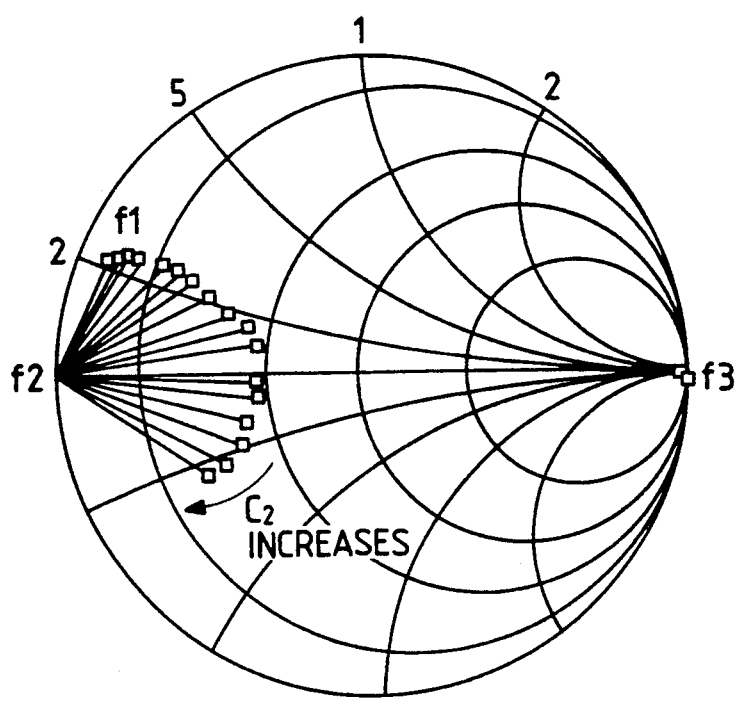
Figure 6A:
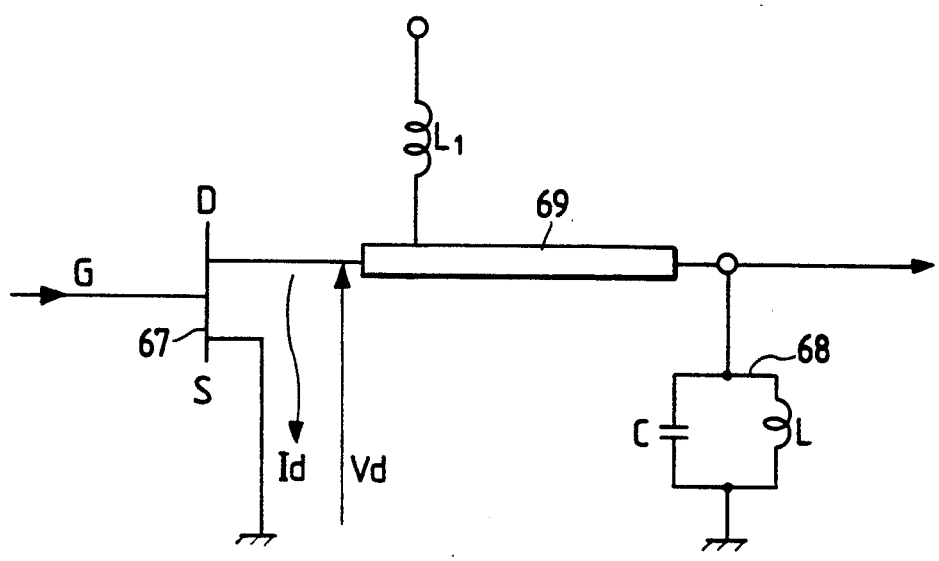
FIG. 6(a) is a schematic diagram of a conventional high-frequency power amplifier.
Figure 6B:
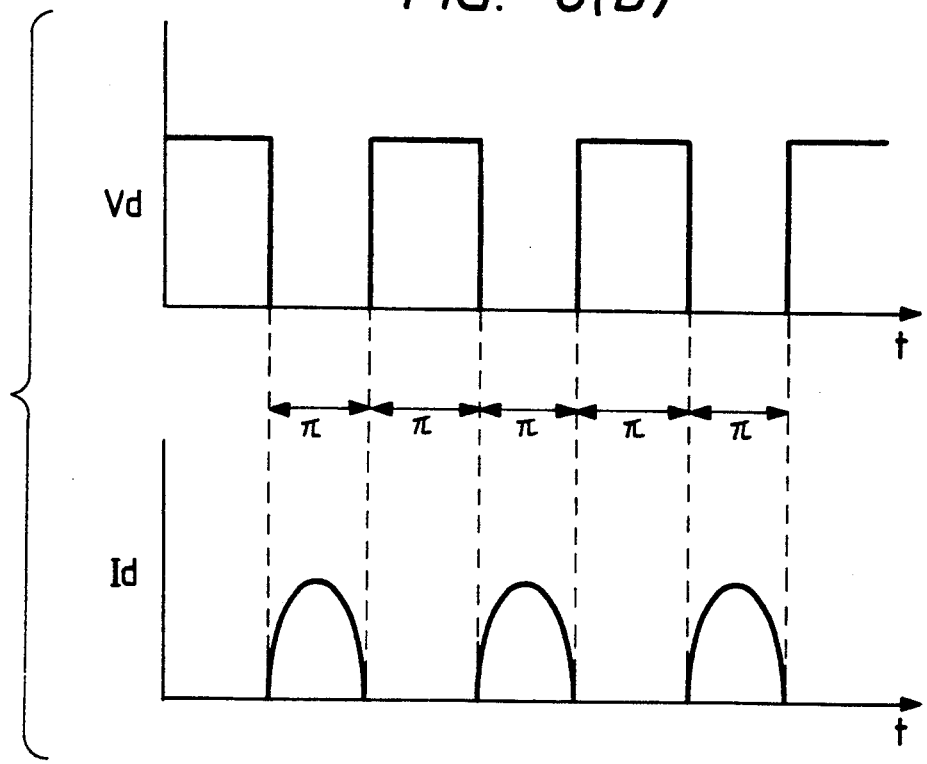
FIG. 6(b) is a waveform diagram showing a drain voltage and a drain current of an FET in the high-frequency power amplifier shown in FIG. 6(a).

FIGS. 5(a) and 5(b) show the result of simulation of the load impedance seen from the drain electrode of the amplifying device 7 in the foregoing circuit arrangement. Plotted on these Smith charts is the impedance value for a fundamental frequency of $f_1$, second harmonic frequency of $f_2$ and third harmonic frequency of $f_3$, with the capacitance of the capacitor $C_1$ being fixed to 3 pF and the capacitor $C_2$ being varied from 0 to 3 pF. FIG. 5(a) is the case where the capacitor $C_2$ is connected at the same positions as the stubs, and FIG. 5(b) is the case where the capacitor $C_2$ is connected at the positions nearer to the drains by about 10° than the positions of stubs. The charts reveals that the transmission lines are virtually short-circuit for $f_2$ and virtually open for $f_3$, and only impedance for the fundamental frequency $f_1$ varies.

Although in the above embodiment the short-circuit stubs are connected at the positions of quarter wavelength on the transmission lines measured from the drain electrodes, the same effectiveness is expected when the stubs are connected directly to the drain electrodes. However, it is not easy actually to connect the stubs directly to the drain electrodes, and even in this case the connecting the stubs through bonding wires or bonding pads cannot accomplish an accurate short-circuit in the high frequency region. In contrast, the connecting the stubs through transmission lines, with the line length being selected appropriately so as to have a distance of quarter wavelength to the drain electrodes, enables an accurate short-circuit.

Figure 2:
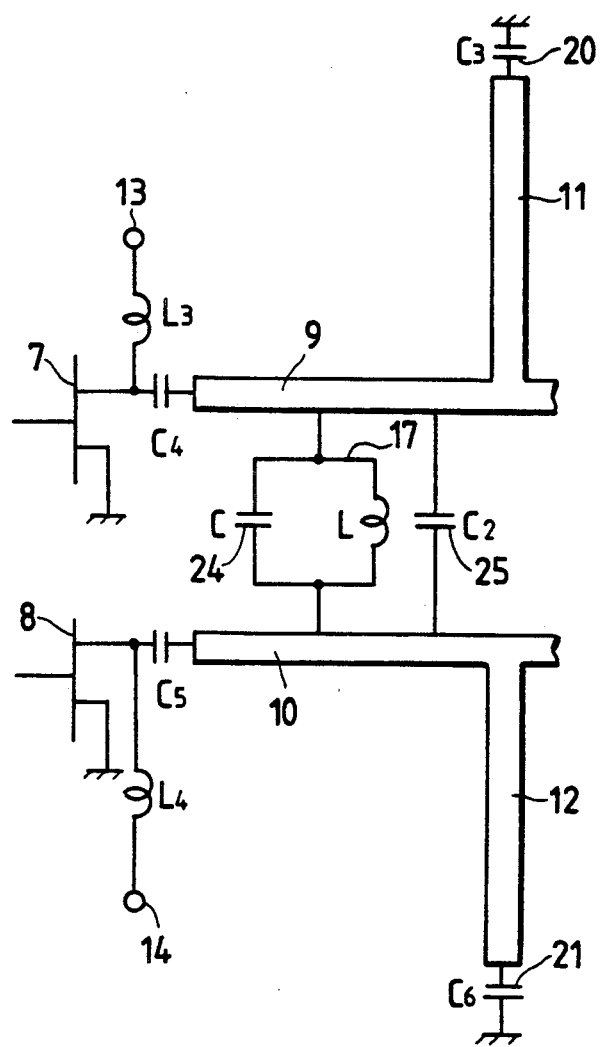
FIG. 2 is a schematic diagram showing a principal part of a high-frequency power amplifier based on a second embodiment of the present invention.

FIG. 2 is a schematic diagram of an amplifier based on a second embodiment of the present invention. This embodiment is derived from the preceding embodiment, with the capacitor $C_1$ being replaced with a parallel resonance circuit 17 formed of an inductance L and a capacitance C tuned to the fundamental wave. This circuit arrangement provides a virtually open circuit at the drain electrodes for the third harmonic without affecting the fundamental wave.

Figure 3:
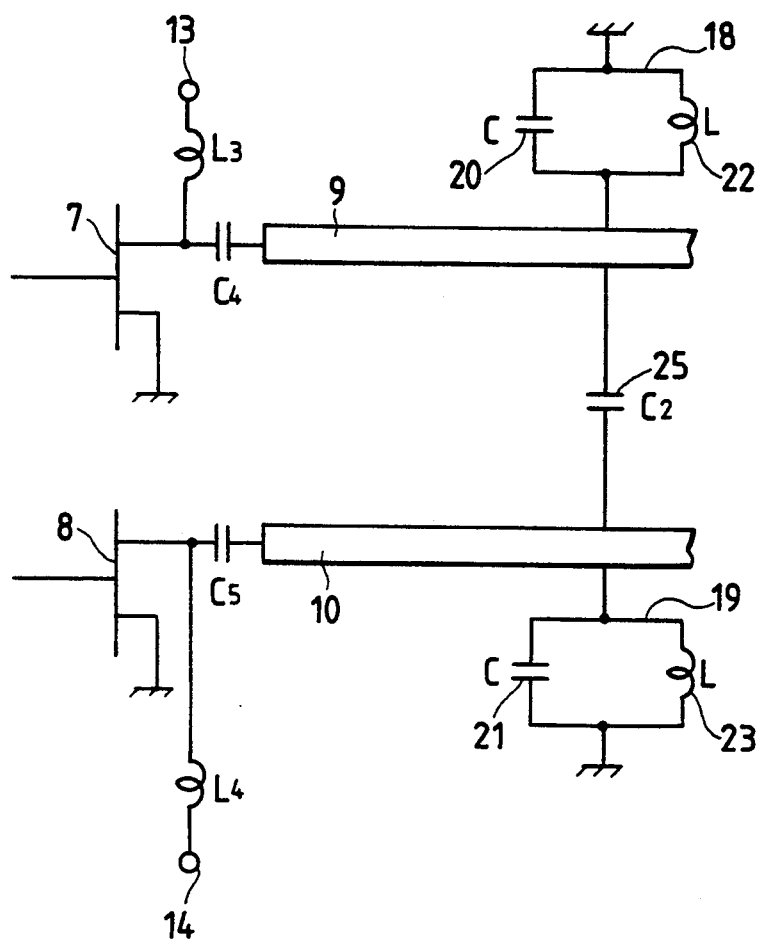
FIG. 3 is a schematic diagram showing a principal part of a high-frequency power amplifier based on a third embodiment of the present invention.
Figure 4A:
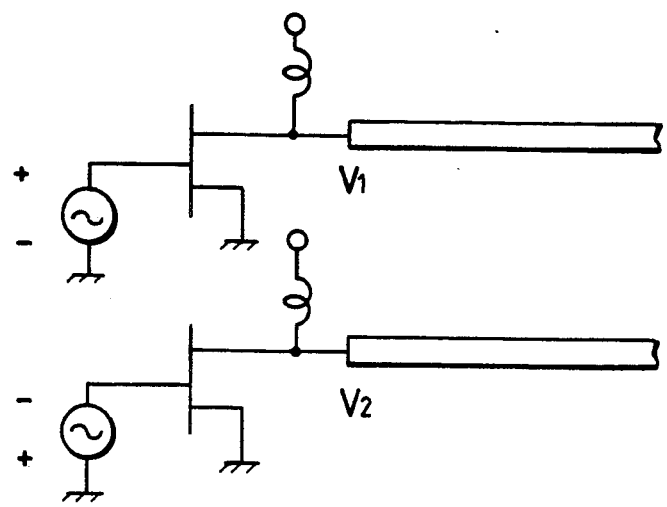
FIG. 4(a) is a schematic diagram showing a basic circuit arrangement of a push-pull high-frequency amplifier.
Figure 4B:
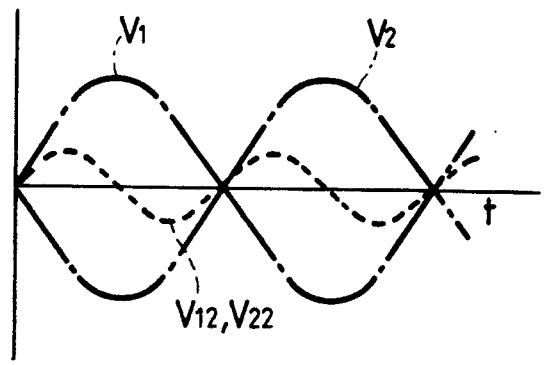
FIG. 4(b) is a waveform diagram showing high-frequency voltage waveforms appearing on transmission lines at outputs of the push-pull high-frequency amplifiers shown in FIG. 4(a)

FIG. 3 is a schematic diagram of an amplifier based on a third embodiment of the present invention. This embodiment uses parallel resonance circuits 18 and 19 each formed of an inductance L and a capacitance C tuned to the fundamental wave in place of the short-circuit stubs in the first and second embodiments. This circuit arrangement provides a short-circuit for even harmonics and a virtually open circuit for odd harmonics at the drain electrodes without affecting the fundamental wave, and it also allows the impedance adjustment for the fundamental wave by means of a capacitor C2 connected at the same positions as the parallel resonance circuits.

According to the present invention, the amplifier in push-pull configuration of two amplifying devices operating in opposite phase mode has an output matching circuit which readily provides a low impedance that is virtually short-circuit for even harmonics, a high impedance that is virtually open for odd harmonics, and optimum impedance matching for the fundamental wave, so that the amplifier has enhanced operational efficiency at a large output.

What is claimed is:

1. A high-frequency power amplifier comprising: a pair of amplifying devices;

a divider which supplies opposite-phase versions of a signal to be amplified to said amplifying devices;

transmission lines connected respectively at one ends thereof to output electrodes of said amplifying devices;

stubs connected respectively to said transmission lines at positions distant from the output electrodes of said amplifying devices by a multiple of a quarter wavelength of a fundamental wave included in output signals of said amplifying devices, and adapted to shortcircuit for a frequency twice the frequency of the fundamental wave included in the output signals of said amplifying devices;

a capacitor connected between said transmission lines, said capacitor providing a load impedance matching to said pair of amplifying devices for the fundamental wave included in the output signals of said amplifying devices; and a combiner which combines signals appearing at another ends of said transmission lines into a signal of a common phase.

2. A high-frequency power amplifier according to claim 1, further comprising another capacitor connected between the transmission lines, and wherein said capacitor is connected at positions intermediate connecting positions of the another capacitor and connecting positions of the stubs.

3. A high-frequency power amplifier according to claim 5, wherein said another capacitor is connected between the transmission lines at positions distant from the output electrodes of said amplifying devices by the 1/12 wavelength of the fundamental wave included in the output signals of said amplifying devices.

4. A high-frequency power amplifier comprising:
a pair of amplifying devices;
a divider which supplies opposite-phase versions of a signal to be amplified to said amplifying devices;
transmission lines connected respectively at one ends thereof to output electrodes of said amplifying devices;
stubs connected respectively to said transmission lines at positions distant from the output electrodes of said amplifying devices by a multiple of a quarter wavelength of a fundamental wave included in output signals of said amplifying devices, and adapted to short-circuit for a frequency twice the frequency of the fundamental wave included in the output signals of said amplifying devices;
a first capacitor connected between said transmission lines at positions distant from the output electrodes of said amplifying devices by the 1/12 wavelength of the fundamental wave included in the output signals of said amplifying devices;
a second capacitor connected between said transmission lines at positions between the connecting positions of said first capacitor and the connecting positions of said stubs; and
a combiner which combines signals appearing at another ends of said transmission lines into a signal of a common phase.

5. A high-frequency power amplifier comprising:
a pair of amplifying devices:
a divider which supplies opposite-phase versions of a signal to be amplified to said amplifying devices;
transmission lines connected respectively at one ends thereof to output electrodes of said amplifying devices;
stubs connected respectively to said transmission lines at positions distant from the output electrodes of said amplifying devices by a multiple of a quarter wavelength of a fundamental wave included in output signals of said amplifying devices, and adapted to short-circuit for a frequency twice the frequency of the fundamental wave included in the output signals of said amplifying devices;
a resonance circuit connected between said transmission lines at positions distant from the output electrodes of said amplifying devices by the 1/12 wavelength of the fundamental wave included in the output signals of said amplifying devices, and adapted to behave parallel resonation at the frequency of the fundamental wave included in the output signals of said amplifying devices;
a capacitor connected between said transmission lines at positions between the connecting positions of said resonance circuit and the connecting positions of said stubs; and
a combiner which combines signals appearing at another ends of said transmission lines into a signal of a common phase.

6. A high-frequency power amplifier comprising:
a pair of amplifying devices;
a divider which supplies opposite-phase versions of a signal to be amplified to said amplifying devices;
transmission lines connected respectively at one ends thereof to output electrodes of said amplifying devices;
resonance circuits connected respectively on said transmission lines at positions distant from the output electrodes of said amplifying devices by a quarter wavelength of a fundamental wave included in output signals of said amplifying devices, and adapted to behave parallel resonation at the frequency of the fundamental wave included in the output signals of said amplifying devices;
a capacitor connected between said transmission lines; and
a combiner which combines signals appearing at another ends of said transmission lines into a signal of a common phase.

* * * * *